United States Patent [19]
Bowers

[11] Patent Number: 5,766,368
[45] Date of Patent: Jun. 16, 1998

[54] INTEGRATED CIRCUIT CHIP MODULE CLEANING USING A CARBON DIOXIDE JET SPRAY

[75] Inventor: Charles W. Bowers, Torrance, Calif.

[73] Assignee: Eco-Snow Systems, Inc., Livermore, Calif.

[21] Appl. No.: 813,267

[22] Filed: Feb. 14, 1997

[51] Int. Cl.⁶ .................................................. B08B 5/02
[52] U.S. Cl. .................. 134/6; 134/2; 134/7; 134/25.4; 134/72; 134/902; 438/115; 438/906; 451/38; 451/39; 451/75; 451/78; 451/102
[58] Field of Search ................. 134/2, 6, 7, 72, 134/25.4, 902; 438/115, 906; 451/38, 39, 75, 78, 102

[56] References Cited

U.S. PATENT DOCUMENTS 5,068,040  11/1991  Jackson ........................ 210/748
5,364,474  11/1994  Williford, Jr. .................. 134/32
5,611,491   3/1997  Bowers ...................... 239/582.1

*Primary Examiner*—Arlen Soderquist
*Assistant Examiner*—Sharidan Carrillo
*Attorney, Agent, or Firm*—R. Craig Armstrong

[57] ABSTRACT

A method of cleaning an integrated circuit chip module prior to attaching wire bonds thereto. The method involves disposing a module containing an integrated circuit chip and IC bond pads without wire bonds in an environmental process enclosure. A carbon dioxide jet spray cleaning system having a spray nozzle and orifice assembly is disposed the environmental process enclosure. A jet spray of carbon dioxide is generated using the jet spray cleaning system. The carbon dioxide jet spray is directed onto the surface of the module such that the spray impacts the IC bond pads and module bond pads to clean unwanted adhesive from the surface of the module and thus clean the IC and module bond pads.

2 Claims, 2 Drawing Sheets

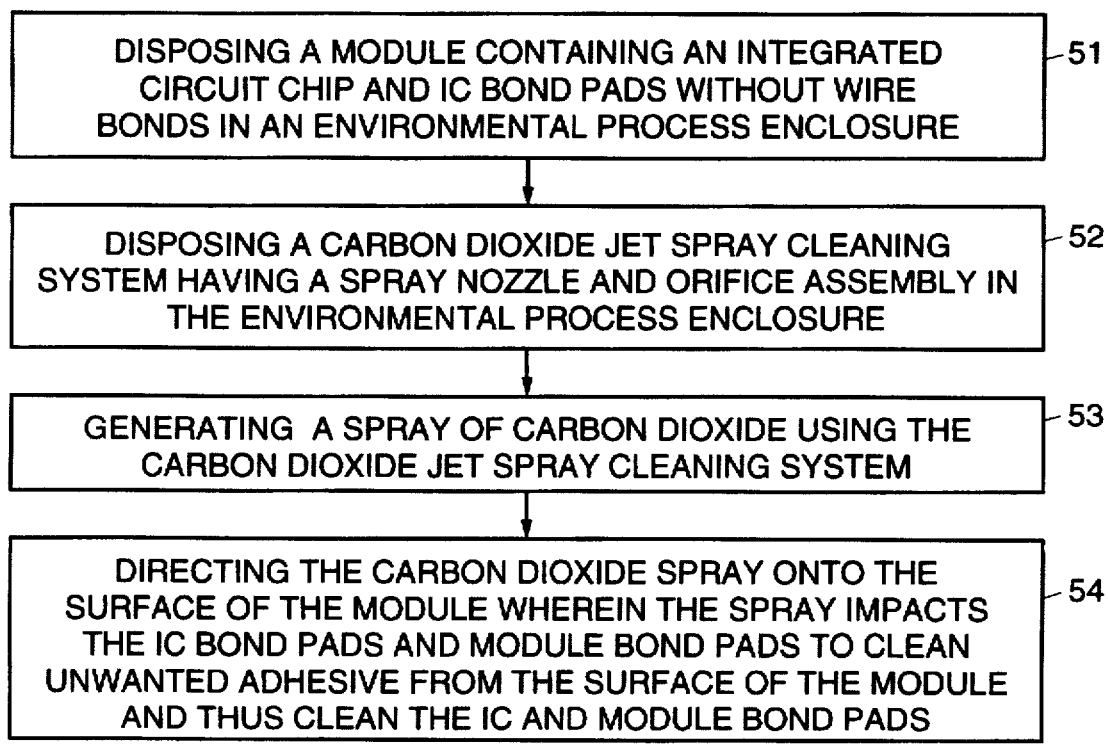

INTEGRATED CIRCUIT CHIP MODULE CLEANING USING A CARBON DIOXIDE JET SPRAY

BACKGROUND

The present invention relates generally to methods for cleaning integrated circuit chip modules, and more particularly, to an integrated circuit chip module cleaning method that employs a cryogenic aerosol spray cleaning agent, such as a liquid carbon dioxide jet spray or nitrous oxide jet spray.

Integrated circuit chips are typically bonded to a carrier module using an adhesive, such as epoxy. Unfortunately, contamination or residue from the epoxy also gets onto bond pads to which the integrated circuit chips are connected. The bond pads are typically made of gold or aluminum, and the presence of the epoxy on the bond pads compromises the integrity of wire bonds made to the bond pads.

More particularly, in the past, because of the delicate nature of the bond pads and integrated circuit chips, no cleaning of the module was performed prior to attaching the wire bonds between the integrated circuit chips and the bond pads. Consequently, potential defects were present in the fabricated modules at sites where the contamination or residue from epoxy compromises the wire bonds. This, of course, leads to component failures.

Accordingly, it is an objective of the present invention to provide for an improved integrated circuit chip module cleaning method using a carbon dioxide jet spray cleaning agent for cleaning the module prior to attaching wire bonds.

SUMMARY OF THE INVENTION

To meet the above and other objectives, the present invention comprises a method of cleaning an integrated circuit chip module prior to attaching wire bonds between an integrated circuit chip that is attached to the module and bond pads formed on the module. The method comprises disposing a module containing an integrated circuit chip and bond pads prior to attaching wire bonds therebetween in an environmental enclosure. A carbon dioxide jet spray system having a spray nozzle is disposed in the environmental enclosure. The carbon dioxide jet spray system is operated to generate a spray of carbon dioxide snow comprising solid aerosol particles and gas. The carbon dioxide jet spray is directed onto the surface of the module wherein the spray impacts the surface adjacent to the wire bond pads formed on the integrated circuit chip and the module. The carbon dioxide jet spray cleans epoxy from the surface and thus cleans the wire bond pads. Wire bonds are subsequently made between IC bond pads on the integrated circuit chip and the bond pads on the module.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 2 is a flow diagram that illustrates details of a method in accordance with the principles of the present invention of cleaning an integrated circuit chip module prior to attaching wire bonds.

DETAILED DESCRIPTION

Figure 1:
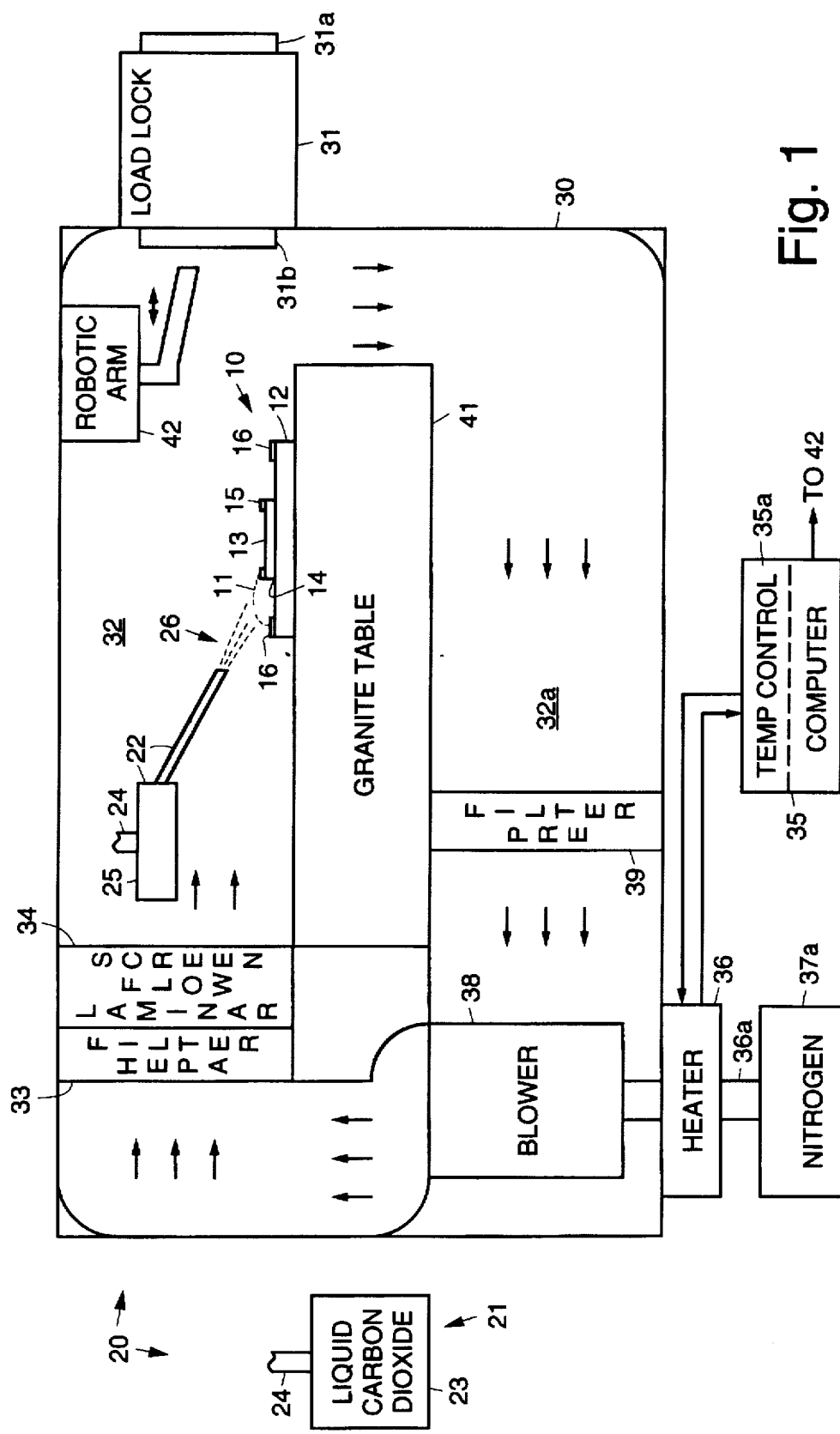
FIG. 1 illustrates cleaning an integrated circuit chip module prior to attaching wire bonds using the present invention.

Referring to the drawing figures, FIG. 1 illustrates cleaning an integrated circuit chip module 10 prior to attaching wire bonds 11, using the present invention. Cleaning of the integrated circuit chip module 10 is accomplished using a carbon dioxide jet spray cleaning system 20 employing a liquid carbon dioxide jet spray 26. Preferably, the carbon dioxide jet spray cleaning system 20 may be an ECO-SNOW™ carbon dioxide jet spray cleaning system 20, for example, manufactured by the assignee of the present invention.

The jet spray cleaning system 20 includes a delivery system 21 that is coupled to a valve assembly 25 disposed in an environmental process enclosure 30. The carbon dioxide jet spray delivery system 21, for example, has a carbon dioxide tank 23 and tubing 24 coupled between the tank 23 and the valve assembly 25. The valve assembly 25 is coupled to a nozzle and orifice assembly 22. The nozzle and orifice assembly 22 produces a spray 26 of gaseous and solid carbon dioxide material that is used to clean the integrated circuit chip module 10 prior to attaching the wire bonds 11.

The environmental process enclosure 30 has a loadlock pass-through 31 having front and rear access doors 31a, 31b. A computer-controlled robotic arm 42 which may be controlled by a computer 35 is disposed in an upper portion of the environmental process enclosure 30. A high efficiency particulate air (HEPA) filter 33, or high flow ultra low particulate air (ULPA) filter 33, and laminar flow screen 34 are disposed in an inner processing chamber 32 of the environmental process enclosure 30. The environmental process enclosure 30 also may include a temperature controller 35a (that may be provided by the computer 35) that is coupled to a heater 36 that surrounds a nitrogen or dry air inlet filter 36a. A high scfm capacity recirculation blower 38 is disposed in the environmental process enclosure 30 for circulating air therethrough, and a nitrogen or dry air (purified gas) purging system 37 including a nitrogen or dry air tank 37a is coupled through the inlet filter 36a to the blower 38. A prefilter 39 is disposed prior to an inlet of the blower 38 such as in a return duct 32a of the environmental process enclosure 30. The use of the filter 33, laminar flow screen 34 and prefilter 39 results in purified uncontaminated air containing no more than about 1–2 parts per million of contaminant particles. A granite table 41 is disposed in the inner processing chamber 32 of the environmental process enclosure 30.

In accordance with the present invention, prior to attaching wire bonds 11, the carrier module 12 with its integrated circuit chip 13 bonded thereto and IC bond pads 15 formed thereon is disposed in the environmental process enclosure 30, such as on the granite table 41. The valve assembly 25 and the nozzle and orifice assembly 22 are disposed above the granite table 41 and are arranged so that the spray 26 of gaseous and solid carbon dioxide snow is directed onto a surface of the integrated circuit chip module 10.

The integrated circuit chip module 10 comprises a carrier module 12 to which an integrated circuit chip 13 is bonded using adhesive 14, such as epoxy 14. The integrated circuit chip 13 has a plurality of IC bond pads 15 formed thereon that are used to couple power and signals to and from the chip 13. The integrated circuit chip module 10 has a plurality of module bond pads 16 formed thereon that are interconnected to the IC bond pads 15 using wire bonds 11. The wire bonds 11 are shown in phantom because they are formed subsequent to processing performed using the present invention. Typical wire bonds 11 are made using gold wire and well known bump bonding techniques, for example. The module bond pads 16 are used to couple signals to and from the module (and hence the integrated circuit chip 13) to a printed wiring board (not shown) to which it is ultimately connected.

The carbon dioxide jet spray cleaning system 20 generates a carbon dioxide jet spray 26 or snow 26. The snow 26 or spray 26 is generated by feeding pressurized liquid carbon dioxide stored in a source 23 or tank 23, such as a liquid carbon dioxide tank 23, through the jet spray nozzle and orifice assembly 22 at a predetermined pressure.

The carbon dioxide jet spray cleaning system 20 is operated to generate a spray 26 of carbon dioxide snow. The spray 26 is directed onto the carrier module 12 such that the spray 26 impacts the IC bond pads 15 and module bond pads 16. The spray 26 cleans the epoxy 14 from the surface of the carrier module 12 and thus cleans the IC bond pads 15 and module bond pads 16. Wire bonds 11 are subsequently made between the IC bond pads 15 on the integrated circuit chip 13 and the module bond pads 16 on the carrier module 12.

For the purposes of completeness, FIG. 2 is a flow diagram that illustrates details of a method 50 in accordance with the principles of the present invention of cleaning an integrated circuit chip module 10 prior to attaching wire bonds 11 thereto. The method 50 comprises disposing 51 a module 10 containing an integrated circuit chip 13 and IC bond pads 15 without wire bonds 11 in an environmental process enclosure 30. A carbon dioxide jet spray cleaning system 20 having a spray nozzle and orifice assembly 22 is disposed 52 in the environmental process enclosure 30. The carbon dioxide jet spray cleaning system 20 is used to generate 53 a spray 26 of carbon dioxide snow 26. The spray 26 is directed 54 onto the surface of the module 10 wherein the spray 26 impacts the IC bond pads 15 and module bond pads 16. The spray 26 cleans epoxy 14 from the surface of the module 10 and thus cleans the IC and module bond pads 15, 16. Wire bonds 11 are subsequently connected between the IC bond pads 15 on the integrated circuit chip and the IC module bond pads 16 on the module 10.

Thus, an integrated circuit chip module cleaning method using a carbon dioxide jet spray cleaning agent to clean the module prior to attaching wire bonds has been disclosed. It is to be understood that the described embodiment is merely illustrative of some of the many specific embodiments which represent applications of the principles of the present invention. For example, other cryogenic aerosol materials, such as nitrous oxide, argon and xenon, for example, may be used in place of carbon dioxide in practicing the present invention. Clearly, numerous and other arrangements can be readily devised by those skilled in the art without departing from the scope of the invention.

What is claimed is:

1. A method of cleaning an integrated circuit (IC) chip module prior to attaching wire bonds thereto, said method comprising the steps of:

disposing a module containing (a) a carrier having module bond pads and (b) an integrated circuit chip having IC bond pads, without wire bonds, in an environmental process enclosure;

disposing a carbon dioxide jet spray cleaning system having a spray nozzle and orifice assembly in the environmental process enclosure;

generating a jet spray of carbon dioxide snow from the spray nozzle and orifice assembly; and directing the carbon dioxide jet spray onto a surface of the module such that the spray of carbon dioxide snow impacts the IC bond pads and module bond pads to clean any unwanted adhesive from the surface of the module and thus clean the IC bond pads and module bond pads.

2. The method of claim 1 wherein the adhesive comprises epoxy.

\* \* \* \* \*